United States Patent
Li et al.

(10) Patent No.: US 11,176,451 B2
(45) Date of Patent: Nov. 16, 2021

(54) CAPACITOR BASED RESISTIVE PROCESSING UNIT WITH SYMMETRIC WEIGHT UPDATE

(71) Applicant: INTERNATIONAL BUSINESS MACHINES CORPORATION, Armonk, NY (US)

(72) Inventors: Yulong Li, Hartsdale, NY (US); Paul M. Solomon, Yorktown Heights, NY (US); Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 487 days.

(21) Appl. No.: 16/159,205

(22) Filed: Oct. 12, 2018

(65) Prior Publication Data
US 2020/0117984 A1   Apr. 16, 2020

(51) Int. Cl.
  *G06N 3/063* (2006.01)
  *G06N 3/08* (2006.01)
  *G11C 11/24* (2006.01)
  *G11C 11/54* (2006.01)

(52) U.S. Cl.
  CPC ............ *G06N 3/0635* (2013.01); *G06N 3/08* (2013.01); *G11C 11/24* (2013.01); *G11C 11/54* (2013.01)

(58) Field of Classification Search
  CPC .................................................. G06N 3/0635
  See application file for complete search history.

(56) References Cited

U.S. PATENT DOCUMENTS

| | | | |
|---|---|---|---|
| 4,839,700 A | 6/1989 | Ramesham et al. | |
| 5,343,555 A * | 8/1994 | Yayla | G06N 3/0675 706/35 |
| 5,717,624 A | 2/1998 | Kusumoto et al. | |
| 7,079,436 B2 | 7/2006 | Perner et al. | |
| 9,501,739 B2 * | 11/2016 | Matsuoka | G06N 3/04 |
| 9,715,656 B1 | 7/2017 | Gokmen | |

(Continued)

OTHER PUBLICATIONS

Gokmen, "Acceleration of Deep Neural Network Training with Resistive Cross-Point Devices: Design Considerations", Frontiers in Neuroscience, vol. 10, Article 333, Jul. 2016, pp. 1-13.

(Continued)

*Primary Examiner* — Douglas King
(74) *Attorney, Agent, or Firm* — Tutunjian & Bitetto, P.C.; Randall Bluestone (57) ABSTRACT

Systems and methods for a capacitor based resistive processing unit with symmetrical weight updating include a first capacitor that stores a charge corresponding to a weight value. A readout circuit reads the charge stored in the first capacitor to apply a weight to an input value corresponding to an input signal using the weight value to produce an output. An update circuit updates the weight value stored in the first capacitor, including a second capacitor in communication with the first capacitor to transfer an amount of charge to the first capacitor according to an error of the output by changing a voltage difference across the first capacitor by a voltage change corresponding to the amount of charge, the voltage difference corresponding to the charge stored in the first capacitor.

19 Claims, 8 Drawing Sheets

(56) References Cited

U.S. PATENT DOCUMENTS

| | | |
|---|---|---|
| 9,779,355 B1 | 10/2017 | Leobandung |
| 9,852,790 B1 | 12/2017 | Gokmen et al. |
| 2005/0128803 A1* | 6/2005 | Luk .................... G11C 11/405 |
| | | 365/175 |
| 2015/0379395 A1 | 12/2015 | Pickett |
| 2018/0114572 A1 | 4/2018 | Gokmen et al. |

OTHER PUBLICATIONS

Kim, "Neural Synaptic Weighting with a Pulse-Based Memristor Circuit", IEEE Transactions on Circuits and Systems, vol. 59, No. 1, Jan. 2012, pp. 148-158.

Kim, "Analog CMOS-based Resistive Processing Unit for Deep Neural Network Training", IEEE 60th International Midwest Symposium on Circuits and Systems, Jun. 2017, pp. 422-425.

* cited by examiner

CAPACITOR BASED RESISTIVE PROCESSING UNIT WITH SYMMETRIC WEIGHT UPDATE

BACKGROUND

Technical Field

The present invention generally relates to resistive processing units, and more particularly to capacitor based resistive processing units with symmetric weight update.

Description of the Related Art

Hardware acceleration of neural networks can include analog storage of weights for performing operations such as matrix multiplication. Implementations of neural networks can include the learning of weights for a specific application, such as, e.g., for object recognition, speech recognition, natural language processing, and other applications. The learning of weights in a hardware accelerated neural network includes the updating of the weights stored in the analog storage devices. However, updating weights stored with analog devices can be difficult to implement because the update may not be symmetrical between additive and subtractive updates. This asymmetry reduces the performance and the training speed of the neural network. Mitigating the asymmetry by, for example, lengthening a channel of a transistor to reduce output conductance of a current source increases the size of the device. As a result, the device would be difficult to scale. Additionally, capacitor based resistive processing unit (RPU) designs can be sensitive to device-to-device variation, which degrades the performance of devices.

SUMMARY

In accordance with an embodiment of the present invention, a capacitor based resistive processing unit with symmetrical weight updating is described. The resistive processing unit includes a first capacitor that stores a charge corresponding to a weight value. A readout circuit reads the charge stored in the first capacitor to apply a weight to an input value corresponding to an input signal using the weight value to produce an output. An update circuit updates the weight value stored in the first capacitor, including a second capacitor in communication with the first capacitor to transfer an amount of charge to or from the first capacitor according to an error of the output by changing a voltage difference across the first capacitor by a voltage change corresponding to the amount of charge, the voltage difference corresponding to the charge stored in the first capacitor. The error of the output can be calculated by machine learning algorithms such as stochastic gradient descend and back propagation.

In accordance with another embodiment of the present invention, a capacitor based resistive processing unit with symmetrical weight updating is described. The resistive processing unit includes a cross-bar array including a word line and a bit line. A first capacitor stores a charge corresponding to a weight value. A readout circuit reads the charge stored in the first capacitor to apply a weight to an input value corresponding to an input signal provided by the word line, the input value being weighted using the weight value to produce an output carried by the bit line. An update circuit updates the weight value stored in the first capacitor, including a second capacitor in communication with the first capacitor to transfer an amount of charge to or from the first capacitor according to an error of the output by changing a voltage difference across the first capacitor by a voltage change corresponding to the amount of charge, the voltage difference corresponding to the charge stored in the first capacitor, a first transfer gate in communication between the first capacitor and a first end of the second capacitor, and a second transfer gate in communication between the first capacitor and a second end of the second capacitor, wherein charge is transferred between the first capacitor and the second capacitor when the first transfer gate and the second transfer gate are closed.

In accordance with another embodiment of the present invention, a method for symmetrical weight updating of capacitor based resistive processing unit is described. The method includes storing a charge corresponding to a weight value with a first capacitor. The charge stored in the first capacitor is read with a readout circuit to apply a weight to an input value corresponding to an input signal using the weight value to produce an output. The weight value stored in the first capacitor is updated with an update circuit, including transferring an amount of charge from a second capacitor to the first capacitor according to an error of the output by changing a voltage difference across the first capacitor by a voltage change corresponding to the amount of charge, the voltage difference corresponding to the charge stored in the first capacitor.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

According to aspects of the present invention, a capacitor can be used in an analog storage cell for analog storage of weights in hardware accelerated neural networks. The capacitor of the analog storage cell can be used to store a charge to represent a value of a weight. Current sources can be used to update the weight value of the capacitor. However, symmetric weight updates are difficult without large current sources, which reduce scalability. Current source based design can also suffer from device-to-device variation which further degrades the performance.

Therefore, a second capacitor is included without a large current source by transferring charge towards and away from the first capacitor. By using the same second capacitor to provide both positive and negative weight updates, the analog storage cell can be reliably manufactured with lower device-to-device variation. As a result, the analog storage cell has improved scalability and reliability, while also having symmetrical weight updates. Thus, performance of the analog storage cell is improved.

Exemplary applications/uses to which the present invention can be applied include, but are not limited to: resistive processing units for analog storage and training of weights for use in matrix operations performed by systems for neural networks, including deep neural networks, such as, e.g., convolutional neural networks, recurrent neural networks, or other neural networks.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Figure 1:
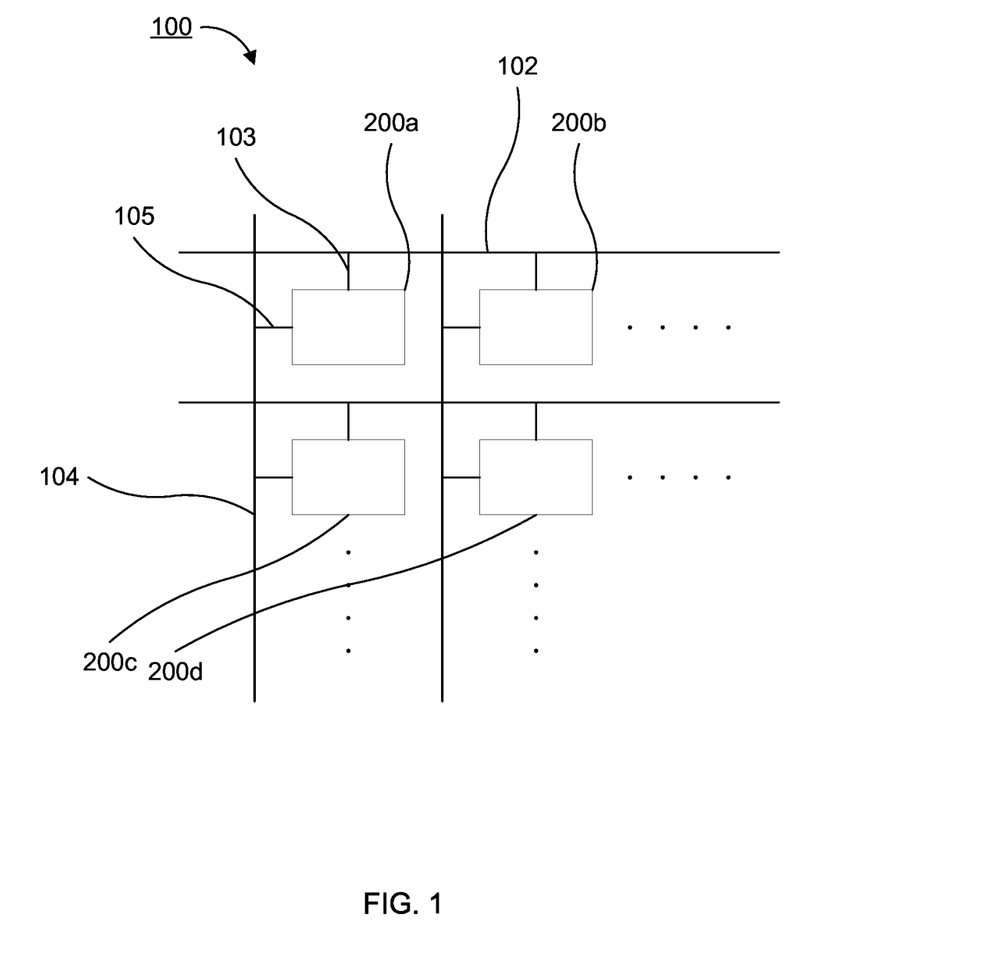
FIG. 1 is a diagram showing an array of analog processing units, in accordance with an embodiment of the present invention.

Referring now to the drawings in which like numerals represent the same or similar elements and initially to FIG. 1, a diagram of an array of analog processing units is illustrated in accordance with an embodiment of the present invention.

According to aspects of the present invention, hardware acceleration of, e.g., machine learning algorithms, including, e.g., neural networks such as convolutional neural networks (CNN) can be performed by a cross-bar array 100 of analog memory cells 200a-d. For example, the analog memory cells 200a-d can each store a weight value in an analog, or continuously variable fashion, such that any value can be reproduced by a unit cell including one of the analog memory cells 200a-d. The weight value can be used to perform matrix operations on input values in a forward pass, and can also be updated according to error in a backward pass.

During a forward pass, a vector of values to be analyzed by the cross-bar array 100 can be provided to the analog memory cells 200a-d via word lines 102. The vector can be a representation of, e.g., a patch of an image to be processed for object recognition, a segment of speech to be processed for natural language processing, or any other application. Thus, the weights can be used to perform matrix operations, such as, e.g., matrix multiplication or convolutions, on each value of the vector. According to this configuration, a first vector can be provided to the array 100 via a word line 102 such that each value is provided on an individual word line 102 to one of the analog memory cells 200a-d. The signal representing the values can be provided from the word lines 102 to each of the analog memory cells 200a-d by word line connections 103.

For example, a first value, in the form of a voltage pulse, is provided to a first analog memory cell 200a corresponding to the first weight. The first analog memory cell 200a performs a multiplication between the stored weight and the first value. Similarly, a second value is provided to a second analog memory cell 200c. To perform the multiplication, a storage component, such as, e.g., a capacitor or memristor, can modify the received signal corresponding to the value from the word line 102 to modify the output current of the received signal. The modification corresponds to a multiplication of values between the value of the vector and the weight. As a result, each of the first and second analog memory cells 200a and 200c can form a first weight vector multiplied with the vector to produce an output signal corresponding to an output value.

The output values from each of the first and second analog memory cells 200a and 200c are output to a bit line 104 via bit line connections 105. By outputting all of the output values to the bit line 104, the output values are summed to generate an updated vector value for a selected index location of the vector. Analog memory cells 200b and 200d can form a second weight vector. Thus, values of a second vector input via word lines 102 can be similarly operated on by the second weight vector and output via a bit line 104. Each column of analog memory cells can be implemented in a similar manner to form each weight vector of a weight matrix.

Output values from the bit lines 102 can be analyzed for error. The determined error of the operations of the analog memory cells 200a-d on each input vector can be fed backward into each of the analog memory cells 200a-d via the bit lines 104. The electrical signal corresponding to the error can adjust the electrical characteristics of the storage component of the analog memory cells 200a-d by, e.g., introducing a charge or discharge signal related to the error value. However, in analog memory cells 200a-d utilizing, e.g., a single capacitor, the charge and discharge signals can be different for a same magnitude of change. In other words, weight update signal corresponding to the error is asymmetrical between positive updates and negative updates. However, a compensation component for encouraging charge and discharge symmetry for positive and negative updates of similar magnitude can be included in the analog memory cells 200a-d. For example, a second capacitor can be included for symmetric weight updates.

Figure 2:
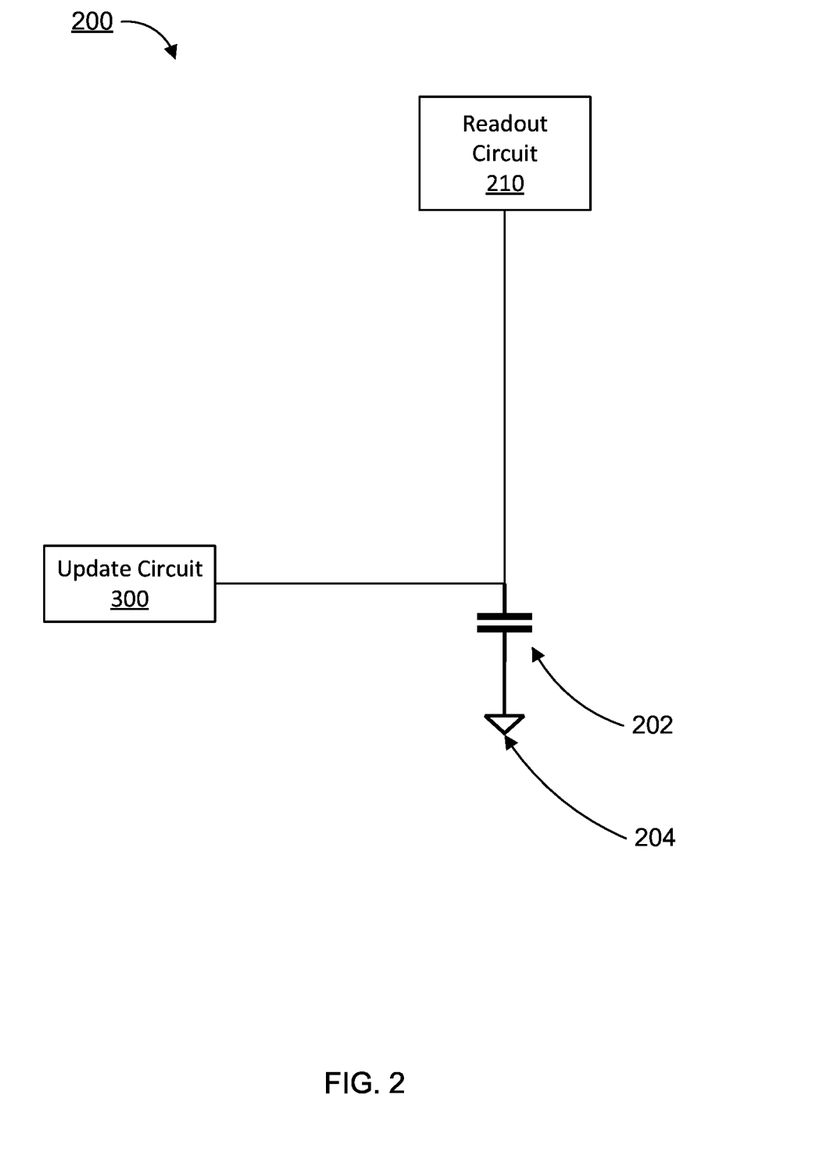
FIG. 2 is a diagram showing a capacitor based analog processing unit, in accordance with an embodiment of the present invention.

Referring now to FIG. 2, a diagram of a capacitor based analog processing unit is illustrated in accordance with an embodiment of the present invention.

According to an embodiment of the present invention, an analog storage cell 200 can include a first capacitor 202 in communication with a readout circuit 210, an update circuit 300 and an equipotential drain 204. The equipotential drain 204 can include a current drain that has a common and consistent potential across each of the update circuit 300, readout circuit 210 and equipotential drain 204. For example, the equipotential drain 204 can include, e.g., a ground.

The first capacitor 202 can be used to store a weight value by storing an electrical charge that is proportional to a value of the weight. Thus, the first capacitor 202 provides a continuously variable information storage device, or an analog storage device that can represent a range of values in analog fashion using charge storage.

The readout circuit 210 is in communication with the first capacitor 202 such that the charge in the first capacitor can be used to perform operations on an input value. For example, a word line can provide an input voltage value to the readout circuit 210 such that the charge of the first capacitor 202 combines with the voltage corresponding to the input value to modify the input value. The modification can correspond to, e.g., multiplication of the input value by a weight value corresponding to the charge of the first capacitor 202. The modified input value can be output by the readout circuit 210 as an output current value. As such, the readout circuit 210 can include, e.g., a transistor, whose conductance is modified by the charge of the first capacitor 202. Thus, the transistor can include, e.g., a field effect transistor (FET) such as, e.g., an n-type FET (nFET) or a p-type FET (pFET).

To train a neural network including the analog storage cell 200, the weight stored by the first capacitor 202 is updated according to an error in the output values. To update the weight, the charge of the first capacitor 202 is modulated according to a desired change in the weight value. For example, an error that dictates a higher weight can be implemented by increasing the charge stored in the first capacitor 202. Similarly, an error indicating that a lower weight is appropriate can be implemented by decreasing the charge of the first capacitor 202. As a result, the update circuit 300 can include components for modulating a voltage difference that moves current towards or away from the first capacitor 202. Thus, the update circuit 300 can include, e.g., a current source, one or more equipotential drains similar to the equipotential drain 204, as well as logic for redirecting current to produce the voltage differential.

According to aspects of the present invention, the update circuit 300 can include components that result in symmetry between positive weight updates and negative weight updates. For example, the update circuit 300 can include a second capacitor to transfer charge to or from the first capacitor. Thus, additional logic, including, e.g., transistors such as FETs, and gate logic circuits, such as, e.g., stochastic pulse circuits, can be implemented to direct charge from the second capacitor to the first capacitor 202 for a positive weight update, or from the first capacitor 202 to the second capacitor for a negative weight update. Thus, the second capacitor can be used to improve the symmetry of the weight updates to improve the performance and reduce the size of the analog storage device 200.

Figure 3:
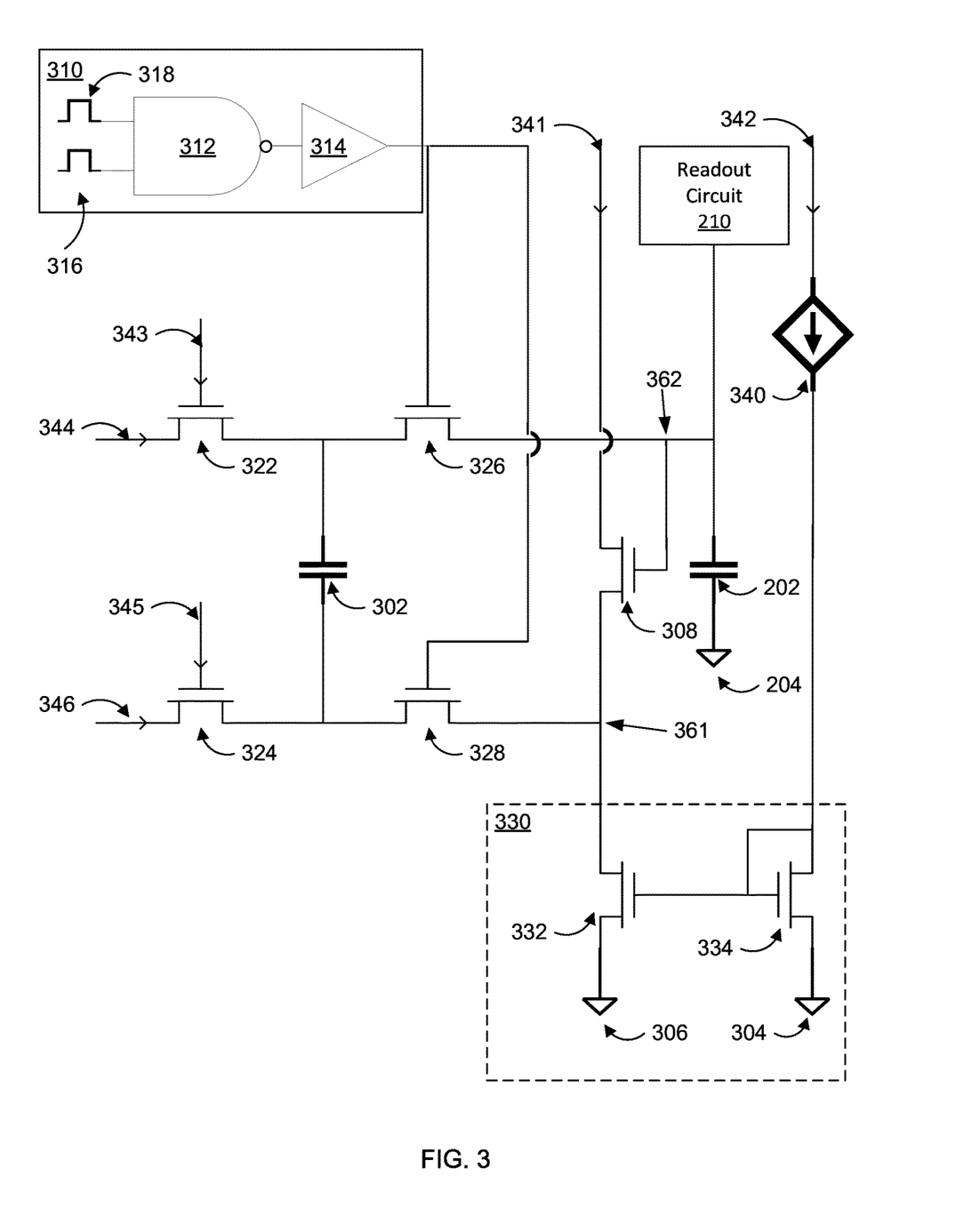
FIG. 3 is a circuit diagram showing a capacitor based analog processing unit with a pre-charge signal, logic gates and a current mirror for symmetric weight updating, in accordance with an embodiment of the present invention.

Referring now to FIG. 3, a circuit diagram of a capacitor based analog processing unit with a pre-charge signal, logic gates and a current mirror for symmetric weight updating is illustrated in accordance with an embodiment of the present invention.

According to an embodiment of the present invention, an update circuit can be connected to a first capacitor 202, a readout circuit 210 and an equipotential drain 204. The readout circuit 210 can employ the charge of the first capacitor 202 to perform operations, such as, e.g., multiplication, on an input value corresponding to a signal input into the readout circuit 210. However, to improve the accuracy of the weight stored in the first capacitor 202, the charge of the first capacitor 202 can be updated according to an error signal, also provided by the readout circuit 210.

To update the charge of the capacitor 202, the update circuit can include a second capacitor 302 for transferring charge to and from the first capacitor 202 according to a positive or negative update, respectively. To accomplish the transfer of charge, the first capacitor 202 and the second capacitor 302 are set in communication with each other such that an equilibrium is achieved. Thus, for a desired change in charge for the first capacitor 202, the second capacitor 302 can be set to a charge corresponding to the desired change.

Transfer of charge to or from the second capacitor 302 is modulated to transfer charge away from or towards the first capacitor 202 on demand, such as, e.g., in response to an error signal. As such, a first transfer gate 326 is in communication with the second node 362 to control the connection between the second capacitor 302 and the second node 362. Similarly, a second transfer gate 328 is in communication with the first node 361 to control the connection of the second capacitor 302 with the first node 361. Each of the first transfer gate 326 and the second transfer gate 328 can include a suitable switching device, such as, e.g., a FET, including, e.g., a nFET, a pFET or other metal oxide semiconductor FET, or any suitable electronically controllable switching device.

To control the first transfer gate 326 and second transfer gate 328, a logic circuit 310 can be included. The logic circuit 310 controls each of the first transfer gate 326 and the second transfer gate 328 by applying a voltage to close each gate. The logic circuit 310 utilizes two stochastic pulse signals 316 and 318. Each of the first stochastic pulse signal 316 and the second stochastic pulse signal 318 have a pulse width and a pulse frequency that is randomly determined. A "NAND" logic gate 312 receives both of the first and second stochastic pulse signals 316 and 318. When combined with the buffer 314, the logic circuit 310 operates as an AND gate. Only when the AND gate receives the first stochastic signal 316 concurrently with the second stochastic signal 318 does it determine a coincidence of pulses and produces a charge transfer signal. Thus, the charge transfer signal is produced when both a pulse from the first stochastic pulse signal 316 and a pulse from the second stochastic pulse signal 318 occur at the same time. As a result, the first and second transfer gates 326 and 328 are triggered, and current can flow between the first capacitor 202 and the second capacitor 302.

When the first and second transfer gates 326 and 328 are actuated to complete a connection between the first and second capacitors 202 and 302, the charge in the second capacitor 302 changes corresponding to a difference in voltage $V_0$ between the first node 361 and second node 362. Thus, the second capacitor 302 can be recharged to, e.g., a pre-determined charge. The charge in the second capacitor 302 is equivalent to the capacitance of the second capacitor $C_2$ multiplied by the voltage drop across the second capacitor $V_C$. The voltage drop across the second capacitor $V_C$ is related to the difference in a first pre-charge voltage 344 and a second pre-charge voltage 346 because the second capacitor 302 is connected on one side to the first pre-charge voltage 324 and on a second side to the second pre-charge voltage 346.

To avoid interference with the transfer of charge with the first capacitor 202, a first pre-charge gate 322 can open to prevent a flow of current from the first pre-charge voltage 344. Similarly, a second pre-charge gate 324 can also open to prevent a flow of current from the second pre-charge voltage 346. The first and second pre-charge gates 322 and 324 can close once the first and second transfer gates 326 and 328 open. Similarly, the first and second pre-charge gates 322 and 326 can open when the first and second transfer gates 326 and 328 close. Thus, the second capacitor 302 is either connected to the first and second pre-charge voltages 344 and 346, or to the first capacitor 202.

Each of the first and second pre-charge gates 322 and 324 can be actuated with an electronic signal including a pre-charge signal. For example, the first pre-charge gate 322 can be actuated by a first pre-charge signal 343 and the second pre-charge gate 324 can be actuated by a second pre-charge signal 345. However, the first pre-charge signal 343 and the second pre-charge signal 345 can be the same to ensure that both of the first and second pre-charge gates 322 and 324 are actuated concurrently. The pre-charge signals 343 and 345 can be generated whenever there is no coincidence in stochastic pulses 316 and 318. Thus, the pre-charge gates 322 and 324 are only actuated to close only when the first and second transfer gates 326 and 328 are open. Additionally, the pre-charge signals 343 and 345 can be produced as a global signal when implemented in a cross-bar array with a plurality of analog memory cells, such as the cross-bar array 100 depicted in FIG. 1.

Accordingly, recharging the second capacitor 302 can be performed without interfering with the charge of the first capacitor 202. Thus, the charge in the second capacitor 302 can be represented by $C_2 * V_C$ where $V_C$ is the difference in voltage between the first pre-charge voltage 344 and the second pre-charge voltage 346. Meanwhile, the voltage difference $V_0$ between the first node 361 and the second node 362 can be set as a constant value as determined by a size of the FET 308 and the current of a current mirror 330.

A charge of the first capacitor 202 is proportional to the voltage difference between the first node 361 and the second node 362. Therefore, the second capacitor 302 can be charged to a level for producing a voltage difference between the first node 361 and the second node 362 that corresponds to the desired charge change. In particular, the charge of the second capacitor 302 can be set as $C_2*(V_0+\Delta V)$. Therefore, the first and second pre-charge voltages 344 and 346 can be used to charge the second capacitor 302 to $C_2*(V_0+\Delta V)$ by setting a difference between the first and second pre-charge voltages 344 and 346 to be equivalent to the voltage difference $V_0$ between the first node 361 and the second node 362 plus the change in voltage $\Delta V$, or $(V_0+\Delta V)$.

As a result, when the first and second pre-charge gates 322 and 324 open and the first and second transfer gates 326 and 328 close, an equilibrium between the first capacitor 202 and the second capacitor 302 is achieved whereby charge is transferred between the first and second capacitors 202 and 302 and the voltage change on first capacitor C1 equals to C2*ΔV/C1.

To modulate current flow from a reference voltage 342 through the update circuitry, a current mirror 330 and current source 340 can be used. The current mirror 330 mirrors the current from the current source 340 to the voltage signal 341. The current mirror 330 includes a first mirror gate 332 and a second mirror gate 334, each grounded to an equipotential drain 306 and 304, respectively. The current mirror 330 thus enforces a precise current to flow through FET 308. When FET 308 works in saturation, the voltage on node 361 follows the voltage on node 362 to provide a constant voltage difference V0.

Figure 4:
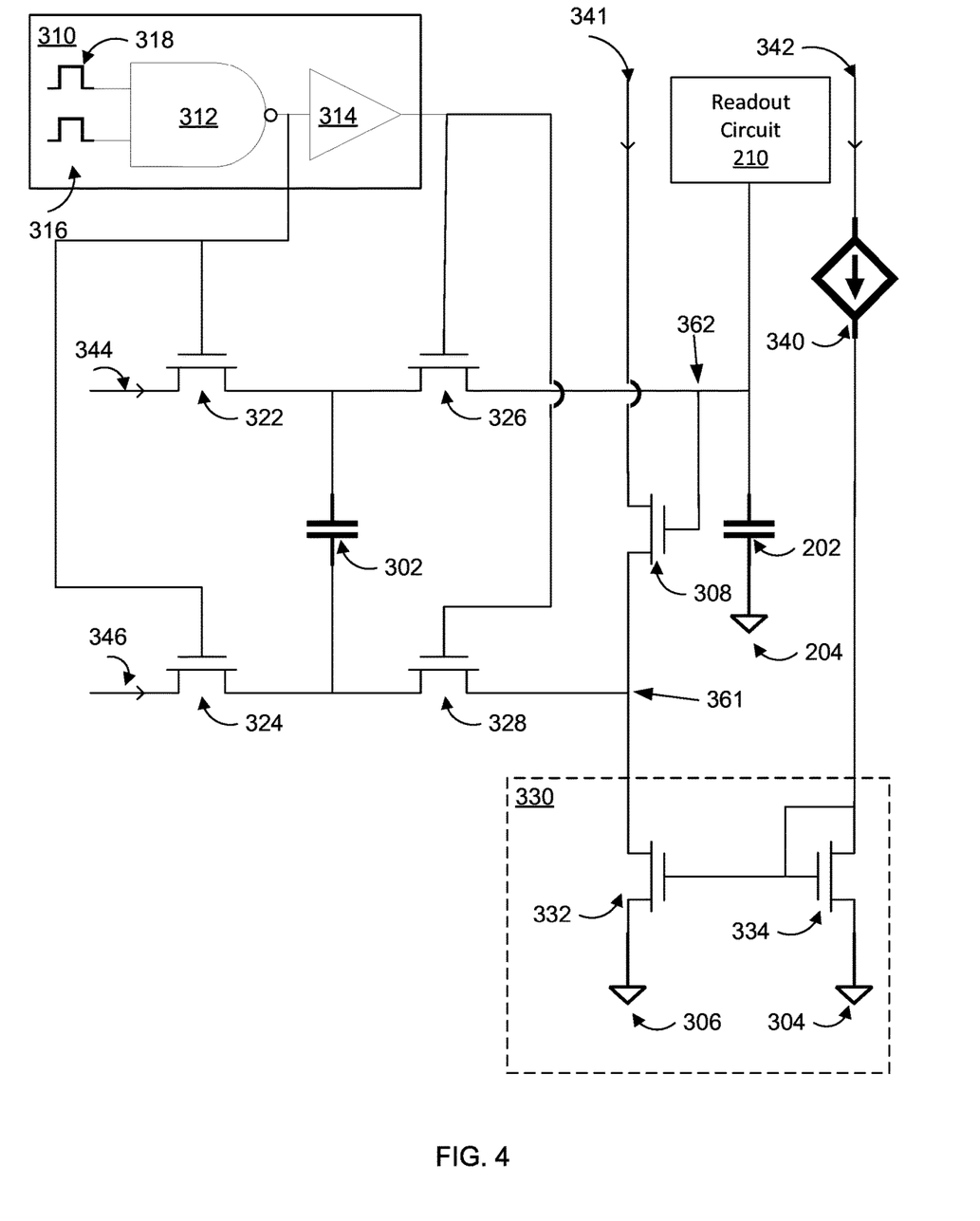
FIG. 4 is a circuit diagram showing a capacitor based analog processing unit with logic gates and a current mirror for symmetric weight updating, in accordance with an embodiment of the present invention.

Referring now to FIG. 4, a circuit diagram of a capacitor based analog processing unit with logic gates and a current mirror for symmetric weight updating is illustrated in accordance with an embodiment of the present invention.

According to an embodiment of the present invention, the first and second pre-charge gates 322 and 324 can be controlled with logic, rather than a pre-charge signal as described above. As a result, the first and second pre-charge gates 322 and 324 can be actuated according to the NAND gate 312 of the logic circuit 310, while the first and second transfer gates 326 and 328 are actuated by the output of the logic circuit 310 configured as an AND gate. Thus, the NAND gate 312 only generates a signal when the first and second pulses 316 and 318 are not coincident. Thus, the NAND gate 312 and the logic circuit 310 provide a signal to the pre-charge gates 322 and 324 and the transfer gates 326 and 328, respectively, under opposite conditions.

As a result, the first and second pre-charge gates 322 and 324 are activated, and thus closed, only when the stochastic pulses 316 and 318 are not coincident. Thus, the pre-charge gates 322 and 324 and the transfer gates 326 and 328 are activated at different times such that a voltage difference between the first and second nodes 361 and 362 does not interfere with recharging the second capacitor 302, and a voltage difference between the first and second pre-charge voltages 344 and 346 does not interfere with charge transfer between the first capacitor 202 and the second capacitor 302.

Figure 5:
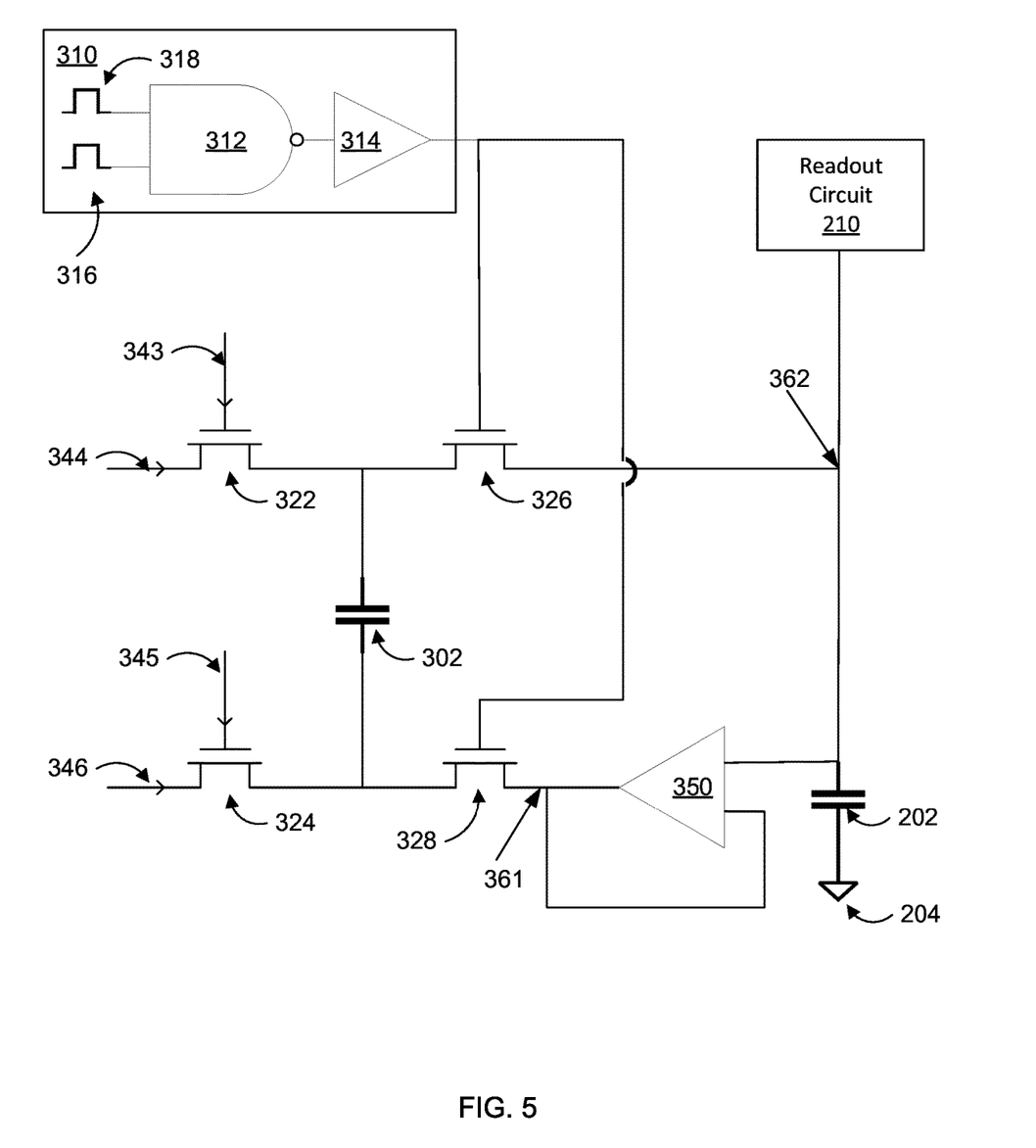
FIG. 5 is a circuit diagram showing a capacitor based analog processing unit with a pre-charge signal, logic gates and a voltage follower for symmetric weight updating, in accordance with an embodiment of the present invention.

Referring now to FIG. 5, a circuit diagram of a capacitor based analog processing unit with a pre-charge signal, logic gates and a voltage follower for symmetric weight updating is illustrated in accordance with an embodiment of the present invention.

According to an embodiment of present invention, similar to FIG. 3 as described above, an update circuit can include a second capacitor 302 connected to a first and a second pre-charge voltage 344 and 346 via first and second pre-charge gates 322 and 324, respectively. The second capacitor 302 can be connected to a first capacitor 202 for transfer charge via first and second transfer gates 326 and 328. The first and second pre-charge gates 322 and 324 are actuated by a pre-charge signal, such as, e.g., a global pre-charge signal in a cross-bar array. Meanwhile, the first and second transfer gates 326 and 328 are actuated by a logic circuit 310 according to a coincidence of stochastic pulses 316 and 318.

However, according to at least the present embodiment, rather than a current mirror for maintaining a fixed voltage difference, a voltage follower 350 is employed to control the voltage between node 361 and capacitor 202. For example, the voltage follower 350 can include, e.g., a buffer amplifier, such as, e.g., an op-amp based unity gain buffer amplifier. Accordingly, a voltage at the first node 361 follows the voltage on the first capacitor 202. The voltage follower 350 can provide a high dynamic range relative to a current mirror, such that various voltages and currents can be accommodated.

Figure 6:
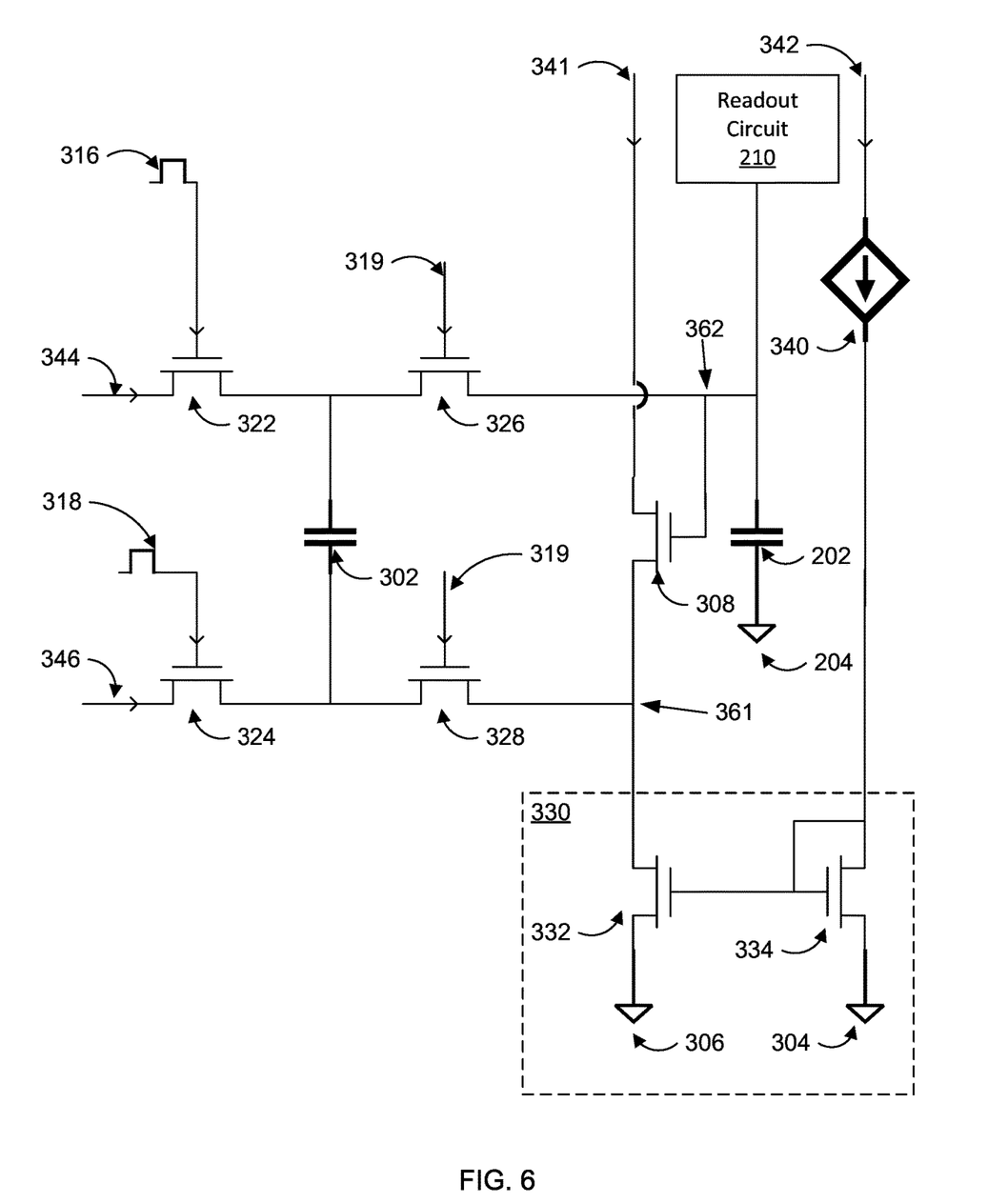
FIG. 6 is a circuit diagram showing a capacitor based analog processing unit with stochastic pulses, a voltage update signal and a current mirror for symmetric weight updating, in accordance with an embodiment of the present invention.

Referring now to FIG. 6, a circuit diagram of a capacitor based analog processing unit with stochastic pulses, a voltage update signal and a current mirror for symmetric weight updating is illustrated in accordance with an embodiment of the present invention.

According to an embodiment of present invention, similar to FIG. 3 as described above, an update circuit can include a second capacitor 302 connected to a first and a second pre-charge voltage 344 and 346 via first and second pre-charge gates 322 and 324, respectively. The second capacitor 302 can be connected to a first capacitor 202 for transfer charge via first and second transfer gates 326 and 328.

However, according to at least the present embodiment, the first and second pre-charge gates 322 and 324 are actuated by first and second stochastic pulses 316 and 318 directly. Thus, the first pre-charge gate 322 can receive first stochastic pulses 316 while the second pre-charge gate 324 receives second stochastic pulses 318. When a pulse from the first stochastic pulse 316 is received, the first pre-charge voltage 344 flows to the second capacitor 302 via the first pre-charge gate 322. Similarly, when a pulse from the second stochastic pulse 318 is received, the second pre-charge voltage 346 flows to the second capacitor 302 via the second pre-charge gate 324. However, when only one of the first or second pre-charge gates 322 and 324 is actuated, then only one end of the second capacitor 302 is connected, while a second end is floating. Thus, charging does not occur. As a result, charging of the second capacitor 302 by the first and second pre-charge voltages 344 and 346 occurs upon coincidence of the first and second stochastic pulses 316 and 318.

The first and second transfer gates 326 and 328 can be actuated by, e.g., an update signal 319. Each of the first and second transfer gates 326 and 328 can be actuated by a same update signal 319, however, separate signals can be used. The update signal 319 can be, e.g., a global signal to actuate transfer gates to update capacitor charges, such as in the first capacitor 202. To prevent actuation of the transfer gates 326 and 328 at the same time as the pre-charge gates 322 and 324, the update signal 319 can be generated after stochastic pulses 316 and 318. Thus, neither transfer gate 326 nor 328 is actuated when either of the pre-charge gates 322 or 324 are actuated. Thus, the transfer gates 326 and 328 and the pre-charge gates 322 and 324 are actuated at different times to prevent interference.

As a result, the pre-charge gates 322 and 324 and the transfer gates 326 and 328 are activated at different times such that a voltage difference between the first and second nodes 361 and 362 does not interfere with recharging the second capacitor 302, and a voltage difference between the first and second pre-charge voltages 344 and 346 does not interfere with charge transfer between the first capacitor 202 and the second capacitor 302.

Figure 7:
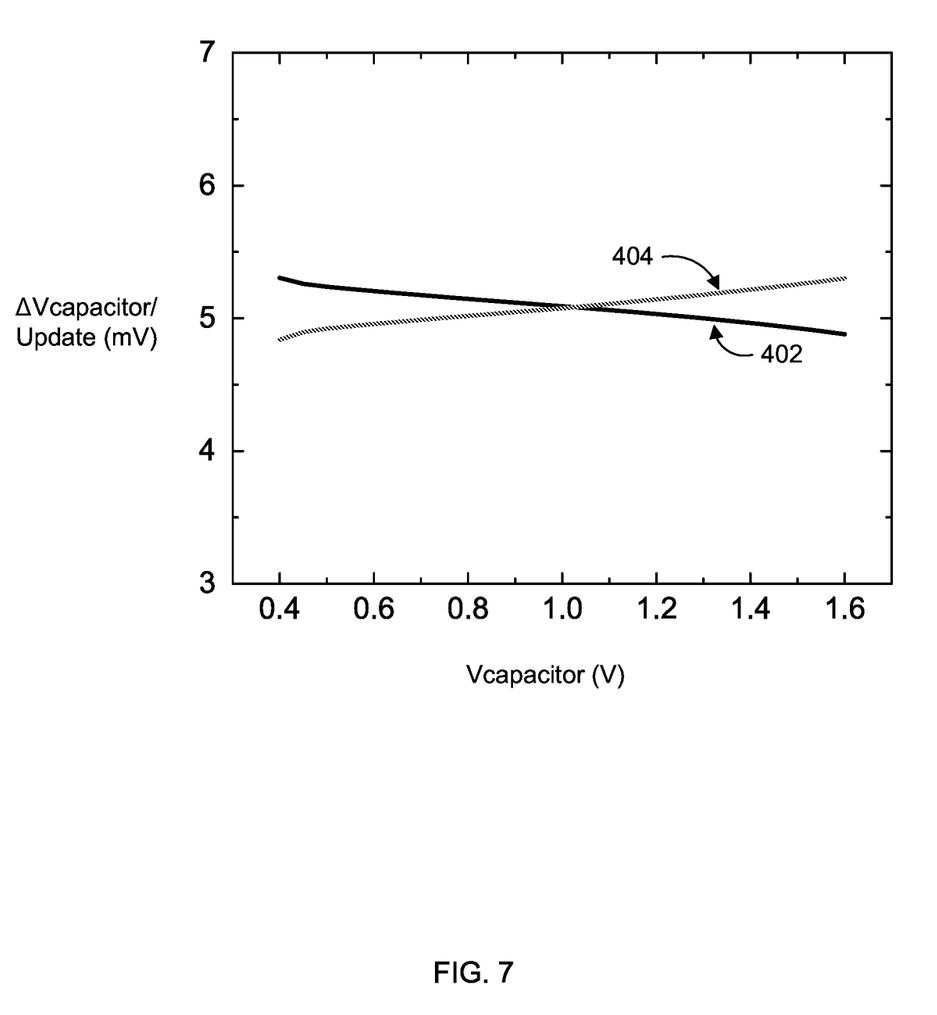
FIG. 7 is a graph showing results of charging and discharging a capacitor based resistive processing unit, in accordance with an embodiment of the present invention.

Referring now to FIG. 7, a graph of results of charging and discharging a capacitor based resistive processing unit is illustrated in accordance with an embodiment of the present invention.

According to aspects of the present invention, a capacitor based resistive processing unit can employ a first capacitor for storing a weight value. The weight value can be updated periodically for accuracy in response to an error signal by using a second capacitor to transfer charge towards or away from the first capacitor.

When using the second capacitor to perform a positive weight change to the weight stored in the first capacitor, charge is added to the capacitor through a positive update 404 to a voltage differential corresponding to the first capacitor. However, when decreasing the weight value stored in the first capacitor, charge is removed from the first capacitor through a negative update 402 to the voltage differential. By performing the update using the second capacitor, the positive update 404 and the negative update 402 are symmetrical with respect to the voltage of the first capacitor. As a result, as the voltage across the first capacitor increases, the change in the voltage in the positive or negative direction for an update are about equal in magnitude to achieve the desired weight update. As a result, the capacitor based resistive processing unit has more symmetrical weight updating due to the second capacitor. Accordingly, the resistive processing unit is more suitable to train neural networks while having smaller components for improved scalability.

Figure 8:
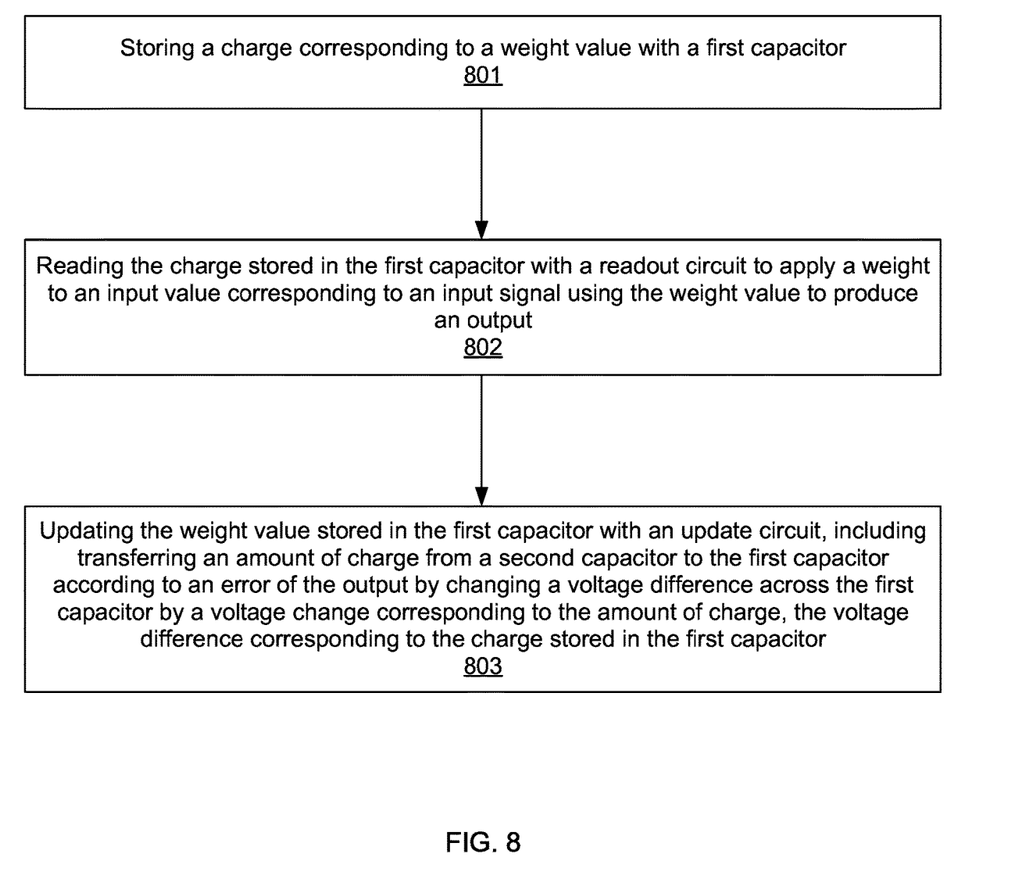
FIG. 8 is a block/flow diagram showing a system/method for symmetric weight updating with a capacitor based analog processing unit, in accordance with an embodiment of the present invention.

Referring now to FIG. 8, a block/flow diagram of a system/method for symmetric weight updating with a capacitor based analog processing unit, in accordance with an embodiment of the present invention.

At block 801, a charge corresponding to a weight value is stored with a first capacitor.

At block 802, the charge stored in the first capacitor is read with a readout circuit to apply a weight to an input value corresponding to an input signal using the weight value to produce an output.

At block 803, the weight value stored in the first capacitor is updated with an update circuit, including transferring an amount of charge from a second capacitor to the first capacitor according to an error of the output by changing a voltage difference across the first capacitor by a voltage change corresponding to the amount of charge, the voltage difference corresponding to the charge stored in the first capacitor.

Having described preferred embodiments of a system and method for capacitor based resistive processing units with symmetric weight update (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A capacitor based resistive processing unit with symmetrical weight updating, the resistive processing unit comprising:
    a first capacitor that stores a charge corresponding to a weight value;
    a readout circuit configured to read the charge stored in the first capacitor to apply a weight to an input value corresponding to an input signal using the weight value to produce an output; and
    an update circuit configured to update the weight value stored in the first capacitor, including:
        a second capacitor in communication with the first capacitor to transfer an amount of charge to or from the first capacitor according to an error of the output by changing a voltage difference across the first capacitor by a voltage change corresponding to the amount of charge, the voltage difference corresponding to the charge stored in the first capacitor;
        a first transfer gate in communication between the first capacitor and a first end of the second capacitor; and
        a second transfer gate in communication between a second end of the second capacitor and a current regulation device, wherein charge is transferred between the first capacitor and the second capacitor when the first transfer gate and the second transfer gate are closed.

2. The resistive processing unit as recited in claim 1, further including a current mirror to generate a voltage that follows the voltage on the first capacitor.

3. The resistive processing unit as recited in claim 1, further including a voltage follower to generate a voltage that follows the voltage on the first capacitor.

4. The resistive processing unit as recited in claim 1, wherein the first transfer gate and the second transfer gate are actuated according to a coincidence of a plurality of stochastic pulses.

5. The resistive processing unit as recited in claim 1, wherein the update circuit further includes:
    a first pre-charge gate in communication between a first pre-charge signal and a first end of the second capacitor; and
    a second pre-charge gate in communication between a second pre-charge signal and a second end of the second capacitor, wherein the second capacitor is charged according to a difference between the first pre-charge signal and the second pre-charge signal when the first pre-charge gate and the second pre-charge gate are closed.

6. The resistive processing unit as recited in claim 5, wherein the first pre-charge gate and the second pre-charge gate are actuated according to a coincidence of a plurality of stochastic pulses.

7. The resistive processing unit as recited in claim 5, wherein the first pre-charge signal and the second pre-charge signal are selected according to the voltage change added to the voltage difference to charge the second capacitor such that a transfer of charge between the first capacitor and the second capacitor is about equal to the amount of charge.

8. The resistive processing unit as recited in claim 1, further including a transistor between the second capacitor and a voltage source, the transistor having a gate actuated by the voltage difference such that the voltage difference is constant.

9. A capacitor based resistive processing unit with symmetrical weight updating, the resistive processing unit comprising:
a cross-bar array including a word line and a bit line;
a first capacitor that stores a charge corresponding to a weight value;
a readout circuit configured to read the charge stored in the first capacitor to apply a weight to an input value corresponding to an input signal provided by the word line, the input value being weighted using the weight value to produce an output carried by the bit line;
an update circuit configured to update the weight value stored in the first capacitor, including:
a second capacitor in communication with the first capacitor to transfer an amount of charge to the first capacitor according to an error of the output by changing a voltage difference across the first capacitor by a voltage change corresponding to the amount of charge, the voltage difference corresponding to the charge stored in the first capacitor;
a first transfer gate in communication between the first capacitor and a first end of the second capacitor; and
a second transfer gate in communication between a second end of the second capacitor and a current regulation device, wherein charge is transferred between the first capacitor and the second capacitor when the first transfer gate and the second transfer gate are closed.

10. The resistive processing unit as recited in claim 9, thither including a current mirror to generate a voltage that follows the voltage on the first capacitor.

11. The resistive processing unit as recited in claim 9, further including a voltage follower to generate a voltage that follows the voltage on the first capacitor.

12. The resistive processing unit as recited in claim 9, wherein the first transfer gate and the second transfer gate are actuated according to a coincidence of a plurality of stochastic pulses.

13. The resistive processing unit as recited in claim 9, wherein the update circuit further includes:
a first pre-charge gate in communication between a first pre-charge signal and a first end of the second capacitor; and
a second pre-charge gate in communication between a second pre-charge signal and a second end of the second capacitor, wherein the second capacitor is charged according to a difference between the first pre-charge signal and the second pre-charge signal when the first pre-charge gate and the second pre-charge gate are closed.

14. The resistive processing unit as recited in claim 13, wherein the first pre-charge gate and the second pre-charge gate are actuated according to a coincidence of a plurality of stochastic pulses.

15. The resistive processing unit as recited in claim 13, wherein the first pre-charge signal and the second pre-charge signal are selected according to the voltage change added to the voltage difference to charge the second capacitor such that a transfer of charge between the first capacitor and the second capacitor is about equal to the amount of charge.

16. The resistive processing unit as recited in claim 9, further including a transistor between the second capacitor and a voltage source, the transistor having a gate actuated by the voltage difference such that the voltage difference is constant.

17. A method for symmetrical weight updating of capacitor based resistive processing unit, the method comprising:
storing a charge corresponding to a weight value with a first capacitor;
reading the charge stored in the first capacitor with a readout circuit to apply a weight to an input value corresponding to an input signal using the weight value to produce an output; and
updating the weight value stored in the first capacitor with an update circuit, including transferring an amount of charge from a second capacitor to the first capacitor according to an error of the output by changing a voltage difference across the first capacitor by a voltage change corresponding to the amount of charge, the voltage difference corresponding to the charge stored in the first capacitor, using a first transfer gate, in communication between the first capacitor and a first end of second capacitor, and a second transfer gate, in communication between a second end of the second capacitor and a current regulation device.

18. The method as recited in claim 17, further including pre-charging the second capacitor according to a difference between a first pre-charge signal and a second pre-charge signal selected according to the voltage change added to the voltage difference.

19. The method as recited in claim 17, wherein transferring the amount of charge from the second capacitor the first capacitor includes completing a circuit that includes the first capacitor and the second capacitor such that the charge in the second capacitor causes a change in the voltage difference that is about equal to the voltage change such that charge in the first capacitor is adjusted according to the voltage change.

* * * * *